United States Patent
Reefman et al.

(10) Patent No.: US 6,975,257 B2
(45) Date of Patent: Dec. 13, 2005

(54) SIGMA-DELTA MODULATION

(75) Inventors: Derk Reefman, Eindhoven (NL); Petrus Antonius Cornelis Maria Nuijten, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/495,538

(22) PCT Filed: Oct. 28, 2002

(86) PCT No.: PCT/IB02/04534

§ 371 (c)(1),
(2), (4) Date: May 13, 2004

(87) PCT Pub. No.: WO03/043197

PCT Pub. Date: May 22, 2003

(65) Prior Publication Data

US 2005/0001749 A1 Jan. 6, 2005

(30) Foreign Application Priority Data

Nov. 15, 2001 (EP) .............................. 01204369

(51) Int. Cl.[7] .............................................. H03M 3/00
(52) U.S. Cl. ....................................... 341/143; 118/120
(58) Field of Search ............................. 341/143, 118, 341/120

(56) References Cited

U.S. PATENT DOCUMENTS

| | | | | | |
|---|---|---|---|---|---|
| 5,103,229 | A | * | 4/1992 | Ribner | 341/143 |
| 5,341,135 | A | * | 8/1994 | Pearce | 341/143 |
| 5,768,315 | A | * | 6/1998 | Mittel et al. | 341/143 |
| 6,232,900 | B1 | * | 5/2001 | Hendricks et al. | 341/143 |
| 6,577,259 | B1 | * | 6/2003 | Jelonnek | 341/143 |

* cited by examiner

*Primary Examiner*—Lam T. Mai

(57) ABSTRACT

Sigma-delta modulation is provided, comprising feeding an input signal to a first SDM, subtracting the output of the first SDM from the input signal, filtering the output of the subtracting to obtain a filtered signal, delaying the input signal, adding the filtered signal to the delayed signal, feeding the output of the adder to a second SDM and providing the output of the second SDM. The first SDM in combination with the subtracting and filtering delivers a correction signal which, by adding it to the input signal, reduces the distortion in the second SDM, which second SDM performs in fact the sigma-delta modulation of the device.

6 Claims, 6 Drawing Sheets

US 6,975,257 B2

SIGMA-DELTA MODULATION

This application is a continuation of PCT/IB02/04534 Oct. 28, 2002.

BACKGROUND OF THE INVENTION

1. Field of the Invention

The present invention relates to sigma-delta modulation.

2. Description of the Related Art

A Sigma-Delta-Modulator (SDM) transforms a bandlimited input signal into a digital output signal. The input signal modulates the output pulse density. FIG. 1 illustrates an example of a SDM signal. The input signal can be reclaimed by low-pass filtering the output signal. FIG. 2 illustrates the basic structure of a conventional SDM 10. The SDM 10 includes an adder 12, a loop filter 14, and a quantizer 16. SDMs may be implemented as analog or digital SDMs.

The clock frequency $f_a$ of the SDM 10 should be much higher than the highest frequency of the input signal $U_e$. To get a sufficiently high signal-to-noise-ratio from the digital output of a CD-player (16 bit/44.1 kHz) oversampling by a factor of at least 32 is generally necessary. For a digital SDM, the input signal should be supplied with this high data rate. This may be achieved by using a digital interpolation filter.

In the simplest case, the loop filter 14 may be implemented as an integrator. FIGS. 3 and 4 illustrate an analog 141 and a digital 142 integrator, respectively.

The loop filter 14 determines the resolution (S/N-ratio) of the SDM 10. By using a loop filter 14 of higher order, a better S/N-ratio can be achieved, but stability problems may arise.

The threshold of the quantizer 16 is normally zero. The output signal $U_a$ of the quantizer 16 is +1, if the input signal to the quantizer 16 $U_k$>0 and −1, if $U_k$<0. The quantizer 16 changes its output with each new clock cycle.

As an example, an analog SDM with an input signal of zero and a first order loop filter operates as follows. When starting, the SDM 10 output is +1. The loop back to the input provides a new input to the loop filter 14 of −1 (input signal (0)−output signal (+1)=−1). The output of the loop filter 14 $U_k$ slowly decreases to the negative supply rail. Therefore, the next clock cycle sets the quantizer 16 output to −1. This gives a new input to the loop filter 14 of +1 (input (0)−output (−1)=+1). $U_k$ now drifts to positive values. The output of the SDM 10 now is a random stream of bits (+1 and −1). FIG. 5 illustrates the values of $U_a$ and $U_k$ at various times. If the input signal $U_e$ of the SDM 10 is zero, the average of the output $U_a$ is also zero. When modulating the SDM 10, the appearance and sequence of +1 and −1 pulses changes accordingly to the input signal $U_e$.

To examine the SDM 10 in the frequency domain, it advantageous to substitute the quantizer 16 with an adder 18, a noise source N(z), and a quantizing amplifier 20 with gain $g_Q$. From FIG. 6 two transfer functions are obtained, the signal transfer function $H_X(z)$ and the noise transfer function $H_N(z)$.

If $$z = e^{j\frac{\omega}{\omega_g}} \quad (1)$$

then:

$$H_X(z) = \frac{Y(z)}{X(z)} = \frac{g_Q H_{lf}(z)}{1 + g_Q H_{lf}(z)} \quad (2)$$

$$H_N(z) = \frac{Y(z)}{N(z)} = \frac{1}{1 + g_Q(H_{lf}(z))} \quad (3)$$

where $g_Q$ is the quantizer gain.

FIG. 7 illustrates two different noise transfer functions $H_N(z)$ for a SDM 10 with a 4th order loop filter with different gains. The noise transfer function $H_N(z)$ shows a strong rejection of the frequencies in the audio range ($f/f_a$=0 . . . 0.01). High frequencies are amplified and passed through. This is also called noise-shaping. The noise level in the audio frequency band may be lowered by increasing the order of the loop filter 14.

There are three possible implementations of a SDM 10, an analog SDM, a digital SDM, and an SDM with a switched capacitor filter (SC-filter). Different applications require different implementations. For example, for an A/D-converter, either the analog SDM or the SC-SDM would be appropriate. For a D/A-converter, the digital SDM is the best choice.

Conventional SDMs are well-known for their insensitivity to analog imperfections, and therefore they are appropriate for a large number of applications. Their usefulness has led to the adoption of the Direct Stream Digital, or DSD, format (the single bit output of an SDM) as the data format for Super Audio CD (SACD). It is believed that the data stream on the SACD can be derived from the A/D conversion step with minimal additional signal processing, thus leading to the highest quality possible. However, conventional SDMs themselves produces signal artifacts, which are due to the non-linear character of the quantizer 16 in the SDM 10. These effects are shown in FIG. 8, where odd harmonic distortion products can be clearly observed.

SUMMARY OF THE INVENTION

An object of the invention is to provide advantageous sigma-delta modulation.

To this end, the present invention provides a sigma-delta modulating device and a method as defined in the independent claims. Advantageous embodiments are defined in the dependent claims.

According to a first aspect of the invention, the sigma-delta modulation comprises feeding an input signal to a first SDM, subtracting the output of the first SDM from the input signal, filtering the output of the subtracting to obtain a filtered signal, delaying the input signal, adding the filtered signal to the delayed signal, feeding the output of the adder to a second SDM and providing the output of the second SDM. The first SDM in combination with the subtracting and filtering delivers a correction signal which, by adding it to the input signal, reduces the distortion in the second SDM, which second SDM performs in fact the sigma-delta modulation of the device.

In a further exemplary embodiment of the present invention, the first and second SDMs are identical SDMs. Identical SDMs are desirable in practical embodiments in order to achieve better results.

In a further exemplary embodiment of the present invention, the first SDM includes a filter in parallel to reduce phase shift errors.

Advantages of the present invention will become more apparent from the detailed description provided hereafter.

However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given below and the accompanying drawings, which are given for purposes of illustration only, and thus do not limit the invention.

DETAILED DESCRIPTION OF THE EXEMPLARY EMBODIMENTS

Embodiments of the present invention are directed to a sigma-delta modulating device wherein non-linearities are reduced. The embodiments are based on the following insight:

If a SDM is modelled as a non-linear element, with the following input-output (x→y) characteristic:

$$y = x + \alpha_3 x^3 \quad (4)$$

when the input signal $$V' = x - \alpha_3 x^3 \quad (5)$$

is fed into the model, the result is an output signal y'; where $$y' = V' + \alpha_3 V'^3 = x - \alpha_3 x^3 + \alpha_3 (x - \alpha_3 x^3)^3 = x + \alpha_3^2 O(x^5) \quad (6)$$

In this way, the harmonic distortion generated by the SDM is significantly reduced. In practice, the number of distortion products in Eq. (4) is much larger, and the input signal can be adjusted accordingly to remove most of the distortion.

Figure 1:
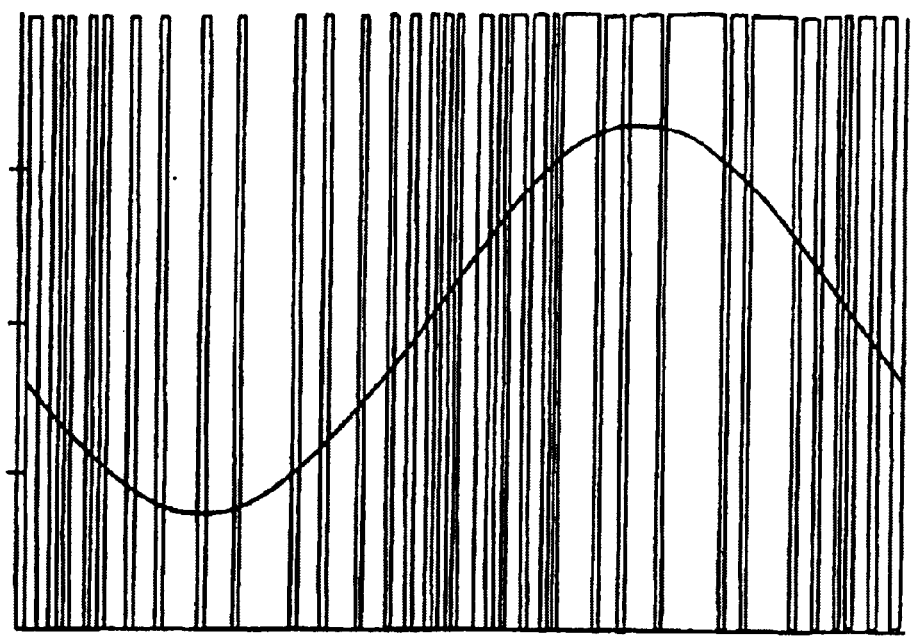
FIG. 1 illustrates an example of a SDM signal.
Figure 2:
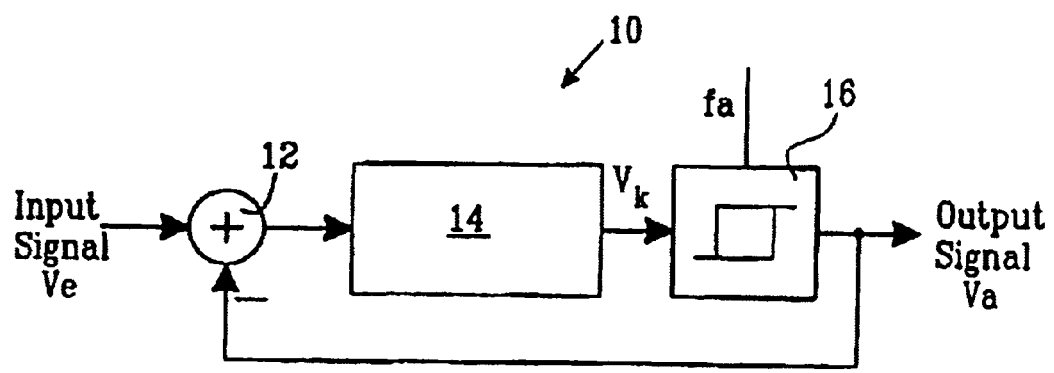
FIG. 2 illustrates the basic structure of a conventional SDM.
Figure 3:
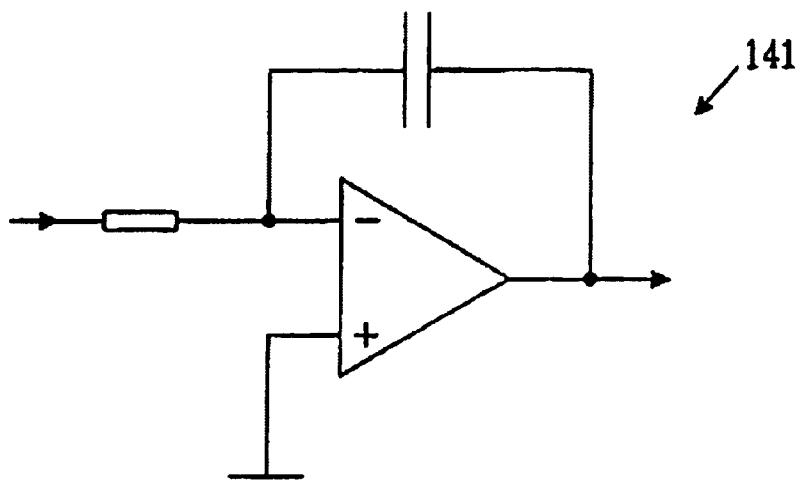
FIG. 3 illustrates a conventional analog integrator.
Figure 4:
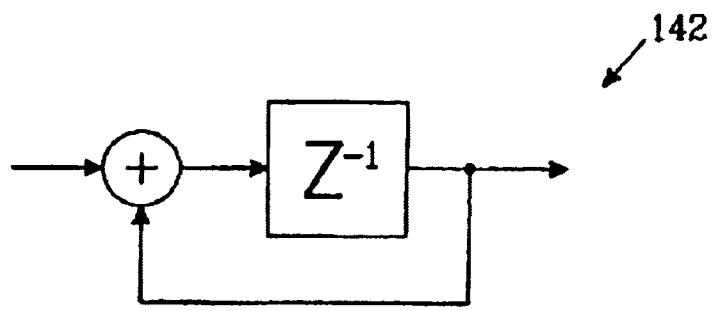
FIG. 4 illustrates a conventional digital integrator.
Figure 5:
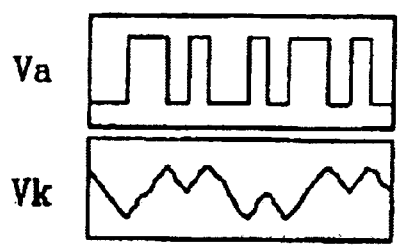
FIG. 5 illustrates the values of the output $U_a$ of the SDM 10 and the output $U_k$ of the loop filter 14.
Figure 6:
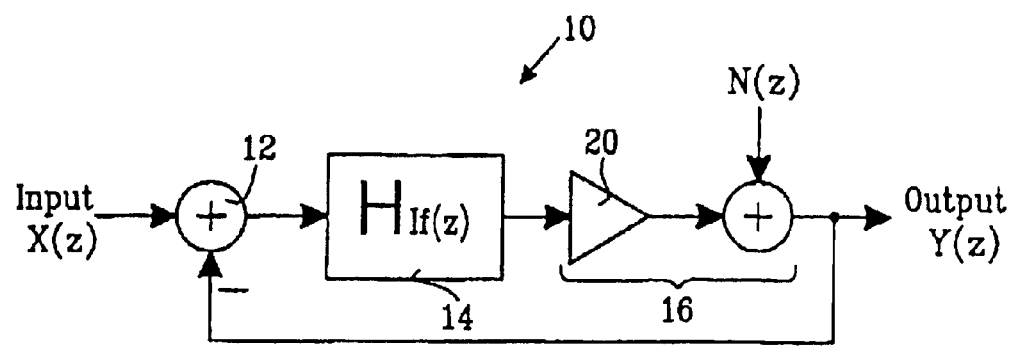
FIG. 6 illustrates the SDM 10 in the frequency domain.
Figure 7:
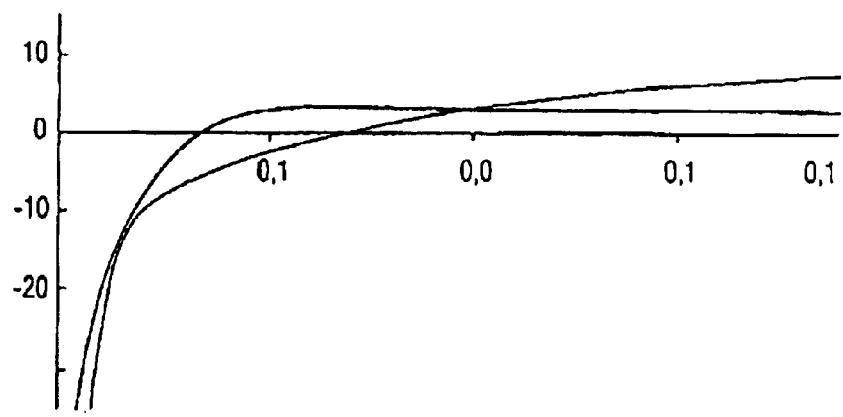
FIG. 7 illustrates two different noise transfer functions $H_N(z)$ for an SDM 10 with a 4th order loop filter.
Figure 8:
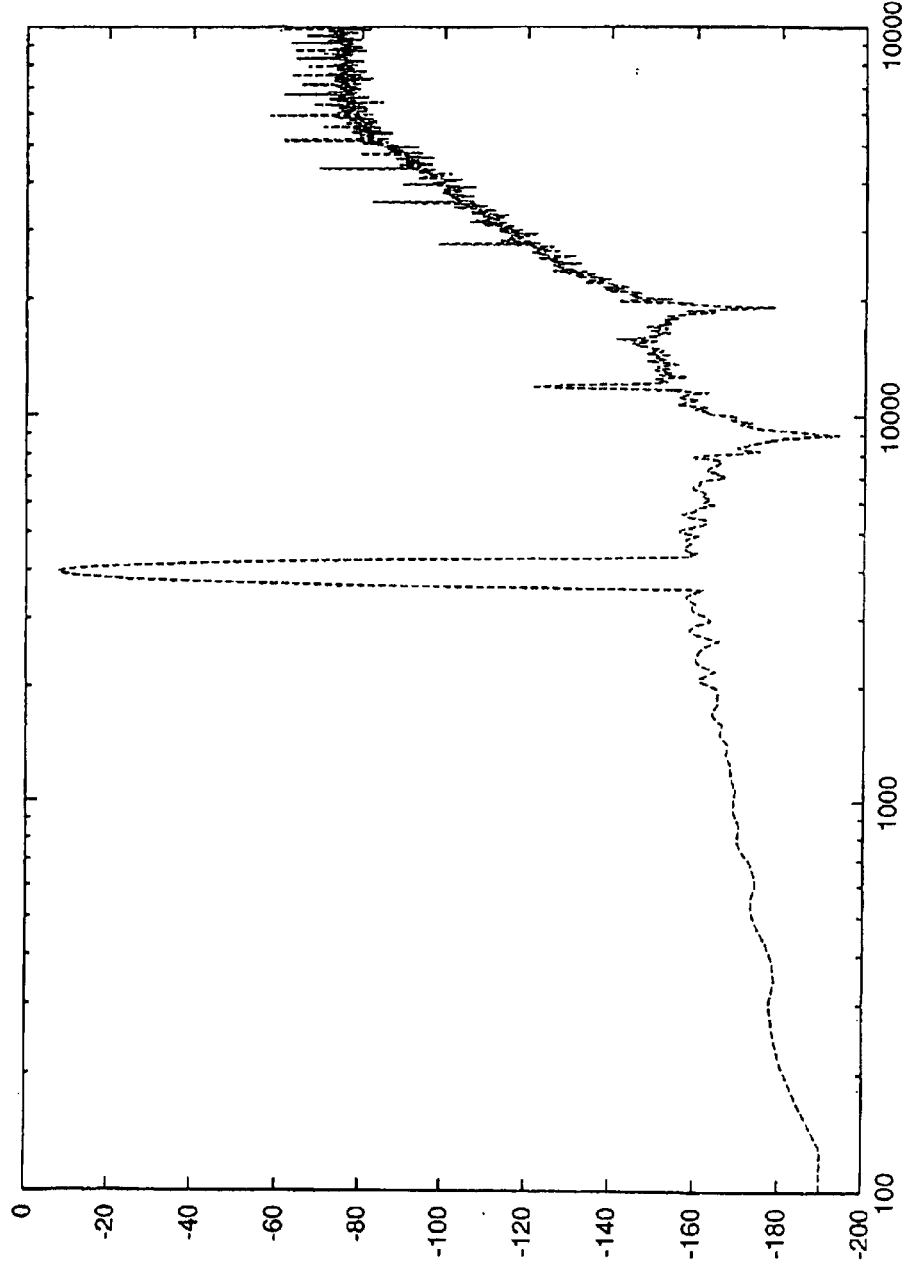
FIG. 8 illustrates signal artifacts, which are due to the non-linear character of the quantizer 16 in the SDM 10.
Figure 9:
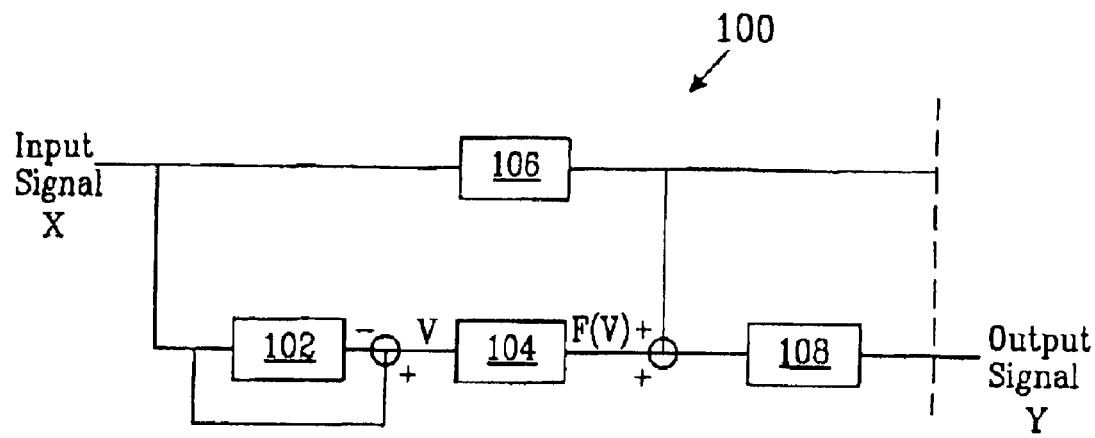
FIG. 9 illustrates a low-order, undithered sigma-delta modulating device, in one exemplary embodiment of the present invention.

An exemplary sigma-delta modulating device 100, which accomplishes this model in the digital domain, is shown in FIG. 9. The sigma-delta modulating device 100 includes a first conventional SDM 102, a filter 104, a delay 106, and a second conventional SDM 108.

The input signal is passed through the SDM 102, after which the output signal of this SDM is subtracted from the input signal x. This results in the signal v. It is noted that x+v has the characteristics of the signal V' in Eq. (5). However, as the output signal of the SDM 102 also contains a high amount of high frequency (HF) noise, which in itself is uncorrelated with the input signal x, the filter 104 is provided to remove most of the HF power. The input signal x, after correction for the delay by filter 104 by delay 106, is also added to the output F(v) of the filter 104 and fed into a second SDM 108, which has the same structure as SDM 102. Delay 106 may be implemented as a sequence of flip-flops. FIG. 9 essentially implements Eq. (6), showing that the signal y is a much cleaner signal compared to that obtained from a single conventional SDM 10.

Figure 10:
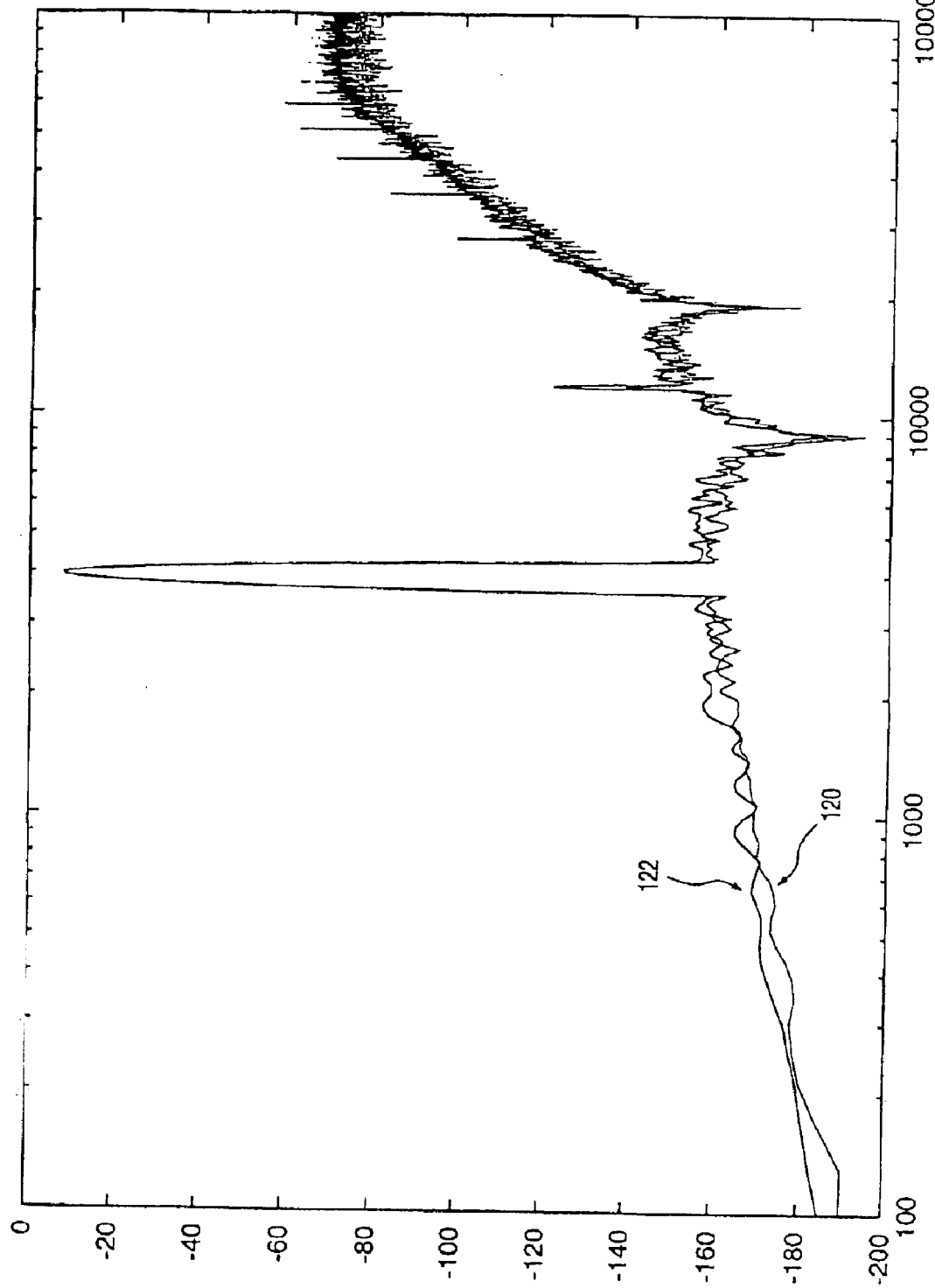
FIG. 10 illustrates a comparison of the output signal from a single conventional SDM with the output from the sigma-delta modulating device of FIG. 9.

An exemplary output of the sigma-delta modulating device 100 is illustrated in FIG. 10, where 120 is the output signal from a single conventional, low-order, undithered, SDM and 122 is the output from the cascade of SDMs of FIG. 9. The improvement is clear.

It is noted that the sigma-delta modulating device 100 of FIG. 9 includes two cascaded SDMs, however more SDMs could also be cascaded to further reduce the residual terms from Eq. (6). It is further noted that the cascade of two or more SDMs may be identical SDMs.

It is further noted that although the sigma-delta modulating device 100 of FIG. 9 reduces for amplitude errors (primarily introduced by an SDM 10), a sigma-delta modulating device could also correct for phase shift errors. Phase shift errors are illustrated in FIG. 10, in particular in the higher frequencies. These phase shift errors may be corrected as illustrated in the exemplary embodiment of FIG. 11.

Figure 11:
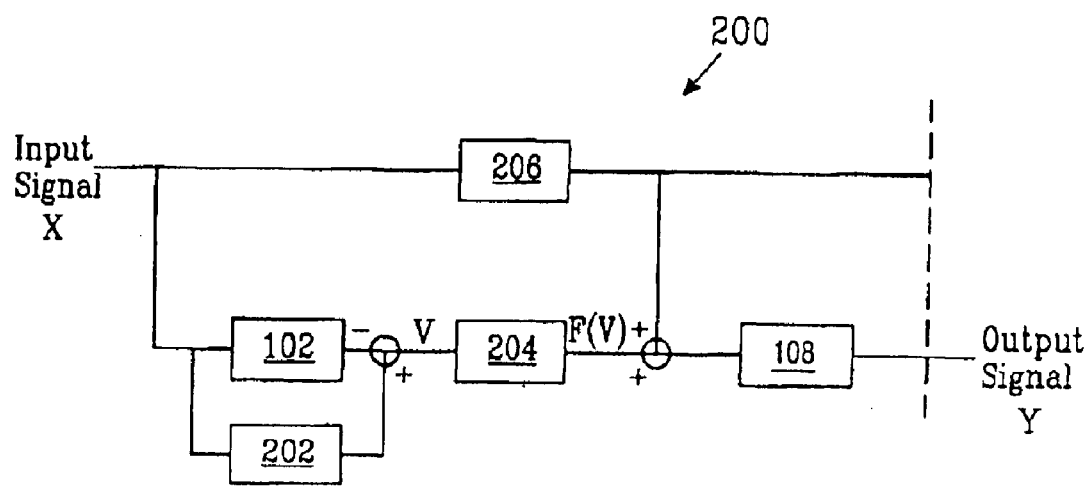
FIG. 11 illustrates a sigma-delta modulating device, in another exemplary embodiment of the present invention.

In the exemplary embodiment of FIG. 11, the sigma-delta modulating device 200 includes a filter 202, added to correct for a (frequency dependent) phase rotation of the input signal to SDM 102. The signal v now contains only the error signal, which is also phase shifted. The filter 204 has a lowpass characteristic to reduce the high frequency noise. Finally, a delay 206 is used to compensate for all delays. The delays may now be a non-integer fraction of the time step (in the digital domain), therefore, delay 206 might be more complicated than a sequence of flip-flops, but still within the skill of an ordinary artisan.

It is further noted that the model of Eq. (4) is exemplary and another model, known to one of ordinary skill in the art could also be used. It is further noted that the processing described above is particular useful in the processing of DSD.

It is further noted that features of the present invention are usable with many types of SDMs, including analog, digital, SC-filter, dithered, undithered, low order, high order, single-bit, multi-bit or any combination of these features. It is further noted that non-linearity is more likely to be a larger problem with single-bit SDMs.

The sigma-delta modulating device according to embodiments of the invention may be included in a signal processing apparatus. Such an apparatus may be (part of) SACD equipment, e.g. a player. The apparatus may further be a DSD-AD converter, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

What is claimed is:

1. A sigma-delta modulating device (100) for modulating an input signal to obtain an output signal, the modulating device comprising:
   - a first sigma-delta modulator (102) for sigma-delta modulating the input signal
   - a subtractor coupled to the first sigma-delta modulator for subtracting an output of the first sigma-delta modulator from the input signal
   - a filter coupled to the subtractor for filtering an output of the subtractor to obtain a filtered signal
   - a delay for delaying the input signal to obtain a delayed input signal
   - an adder for adding the delayed input signal to the filtered signal, and
   - a second sigma-delta modulator (108) having an input coupled to an output of the adder and an output to provide the output signal.

2. The sigma-delta modulating device (100) as claimed in claim 1, wherein said first and second sigma-delta-modulators (102,108) include identical sigma-delta-modulators.

3. The sigma-delta modulating device (100) as claimed in claim 1, wherein said first and second sigma-delta-modulators (102,108) are single-bit sigma-delta-modulators.

4. The sigma-delta modulating device (100) as claimed in claim 1, further comprising a filter (202) in parallel with the first sigma-delta-modulator (102), said first sigma-delta-modulator/filter pair reducing phase shift errors.

5. A signal processing apparatus comprising:
   - an input unit for obtaining a bitstream,
   - a sigma-delta modulating device (100) as claimed in claim 1 to obtain an output signal, and
   - an output unit to provide said output signal.

6. A method for sigma-delta modulating an input signal to obtain an output signal, the method comprising:
   - feeding the input signal to a first sigma-delta modulator
   - subtracting in a subtractor an output of the first sigma-delta modulator from the input signal
   - filtering an output of the subtractor to obtain a filtered signal
   - delaying the input signal
   - adding in an adder the delayed input signal to the filtered signal
   - feeding an output of the adder to a second sigma-delta modulator, and
   - providing an output of the second sigma-delta modulator as the output signal.

* * * * *